(12) United States Patent
Park

(10) Patent No.: US 7,351,652 B2
(45) Date of Patent: Apr. 1, 2008

(54) METHOD OF MANUFACTURING SEMICONDUCTOR DEVICE

(75) Inventor: Shin Seung Park, Kyeongki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 151 days.

(21) Appl. No.: 11/444,064

(22) Filed: May 30, 2006

(65) Prior Publication Data
US 2006/0276028 A1    Dec. 7, 2006

(30) Foreign Application Priority Data
Jun. 1, 2005    (KR)    ...................... 10-2005-0046857

(51) Int. Cl.
*H01L 21/4763* (2006.01)
(52) U.S. Cl. ...................... 438/637; 438/686
(58) Field of Classification Search ................ 438/637, 438/686
See application file for complete search history.

(56) References Cited

U.S. PATENT DOCUMENTS

| 6,455,424 | B1 * | 9/2002 | McTeer et al. ............. 438/675 |
| 6,521,532 | B1 * | 2/2003 | Cunningham .............. 438/687 |
| 2005/0158946 | A1 * | 7/2005 | Taylor et al. ............... 438/243 |

FOREIGN PATENT DOCUMENTS

| KR | 1020000052058 A | 8/2000 |
| KR | 1020040074355 A | 8/2004 |

* cited by examiner

*Primary Examiner*—Fernando L. Toledo
(74) *Attorney, Agent, or Firm*—Townsend and Townsend and Crew LLP

(57) ABSTRACT

A method of manufacturing a semiconductor device includes providing a semiconductor substrate on which a plurality of transistors are defined; forming a wiring pattern over the transistors, the wiring pattern contacting at least one transistor; depositing a first oxide film over the wiring pattern; defining a first contact hole on the oxide film, the first contacting hole exposing the wiring pattern; forming a lower metal layer having a first barrier metal layer, a first metal layer and a second barrier metal layer over the oxide film, the lower metal layer filling the first contact hole; forming a contact hole stop conduction layer over the lower metal layer; depositing a second oxide film over the contact hole stop conduction layer; etching a selected portion of the second oxide film to form a hole exposing the contact hole stop conduction layer; etching the exposed contact hole stop layer to define a second contact hole; forming a contact plug within the second contact hole, the contact plug contacting the lower metal layer; and forming an upper metal layer including a third barrier metal layer and a second metal layer, the upper metal layer contacting the contact plug.

15 Claims, 4 Drawing Sheets

METHOD OF MANUFACTURING SEMICONDUCTOR DEVICE

BACKGROUND

The present invention relates to a method of manufacturing a semiconductor device. More particularly, the present invention relates to a method of manufacturing a semiconductor device including a multi-layer metal wiring pattern.

Generally, a semiconductor device includes a device pattern layer 12 having a plurality of unit device patterns (not shown) on a semiconductor substrate 11, as shown in FIG. 1. An Inter Layer Dielectric (ILD) oxide film 13 is deposited on the device pattern layer 12. Lower metal layers 14, 15 and 16 are sequentially formed on the ILD oxide film 13. The lower metal layers 14, 15 and 16 are patterned.

An Inter Metal Dielectric (IMD) oxide film 17 is then deposited on the entire structure. A contact hole (not shown) for forming a contact plug 18 is formed within the IMD oxide film 17. Thereafter, the contact hole is filled with a conductive material to form the contact plug 18. Upper metal layers 19, 20 are sequentially formed on the entire structure.

When the contact hole is formed within the IMD oxide film 17, only the IMD oxide film 17 is to be etched. As can be seen in FIG. 1, however, a portion of the lower metal layer 16 and the lower metal layer 15 may also be etched (i.e., a punch through phenomenon may occur).

If the lower metal layer 16 is etched as described above, the contact resistance between the lower metal layers 14, 15 and 16 and the upper metal layers 19 and 20 is changed. As a result, the yield is lowered during the mass production of the semiconductor devices.

To prevent the problem described above, sufficient punch through margins can be obtained by increasing the thickness of the lower metal layer 16. In the case of highly-integrated semiconductor devices, however, there is a limit to how thick the lower metal layer 16 can be increased. In addition, the extra thickness of the lower metal layer 16 increases the amount of etching needed when the lower metal layers 14, 15 and 16 are patterned. In a subsequent deposition process of the IMD oxide film 17, the IMD oxide film 17 does not fully bury the etched portions of the lower metal layers 14, 15 and 16. Accordingly, voids may be generated.

SUMMARY OF THE INVENTION

An embodiment of the present invention relates to a method of manufacturing a semiconductor device in which variations in the contact resistance between the upper metal layer and the lower metal layer can be minimized and yields can be improved when the semiconductor device is mass produced.

A method of manufacturing a semiconductor device according to an aspect of the present invention includes the steps of providing a semiconductor substrate on which a plurality of unit elements and a wiring pattern are sequentially formed; depositing an ILD oxide film on the entire structure and performing a photolithography and etch process on the ILD oxide film to form a first contact hole; sequentially depositing a first barrier metal layer, a first metal layer and a second barrier metal layer on the entire ILD oxide film to bury the first contact hole with the first barrier metal layer and the first metal layer, and forming a lower metal layer including the first barrier metal layer, the first metal layer and the second barrier metal layer; forming a contact hole stop conduction layer on the lower metal layer; forming a photoresist pattern on the contact hole stop conduction layer, and then etching and patterning the contact hole stop conduction layer and the lower metal layer using the photoresist pattern as an etch mask; stripping the photoresist pattern, depositing an IMD oxide film on the entire structure, and then performing a photolithography and etch process on the IMD oxide film to form a second contact hole; forming a contact plug within the second contact hole; and sequentially depositing a third barrier metal layer, a second metal layer and a fourth barrier metal layer on the entire IMD oxide film in the contact plug is formed, and forming an upper metal layer including the third barrier metal layer, the second metal layer and the fourth barrier metal layer.

In one embodiment, a method of manufacturing a semiconductor device includes providing a semiconductor substrate on which a plurality of transistors has been defined. A wiring pattern is formed over the transistors, the wiring pattern being coupled to at least one transistor. An Inter Layer Dielectric (ILD) film is deposited over the wiring pattern. A first contact hole is defined in the ILD film, the first contact hole exposing a portion of the wiring pattern. A lower metal layer including a first barrier metal layer, a first metal layer, and a second barrier metal layer is formed. The lower metal layer contacts the wiring pattern via the first contact hole. A contact hole stop conduction layer is formed over the lower metal layer. The contact hole stop conduction layer and the lower metal layer are patterned to define one or more through-holes. An Inter Metal Dielectric (IMD) film is deposited over the contact hole stop conduction layer, the IMD film filling the one or more through-holes. A selected portion of the IMD film is etched using a first etch step, the first etch stop substantially exposing the contact hole stop conduction layer and removing a portion of the contact hole stop conduction layer, thereby providing the contact hole stop conduction layer with a reduced thickness. The contact hole stop conduction layer of the reduced thickness is etched using a second etch step until the second barrier metal layer is exposed, so that a second contact hole is defined. A contact plug is formed within the second contact hole, the contact plug contacting an upper surface of the lower metal layer. An upper metal layer is formed over the contact plug and the IMD film, the upper metal layer contacting an upper surface of the contact plug.

The first etch step uses an etch gas that has high selectivity to the contact hole stop conduction layer The contact hole stop conduction layer comprises tungsten (W), platinum (Pt), ruthenium (Ru), iridium (Ir) and copper (Cu).

In another embodiment, a method of manufacturing a semiconductor device includes providing a semiconductor substrate on which a plurality of transistors are defined; forming a wiring pattern over the transistors, the wiring pattern contacting at least one transistor; depositing a first oxide film over the wiring pattern; defining a first contact hole on the oxide film, the first contacting hole exposing the wiring pattern; forming a lower metal layer having a first barrier metal layer, a first metal layer and a second barrier metal layer over the oxide film, the lower metal layer filling the first contact hole; forming a contact hole stop conduction layer over the lower metal layer; depositing a second oxide film over the contact hole stop conduction layer; etching a selected portion of the second oxide film to form a hole exposing the contact hole stop conduction layer; etching the exposed contact hole stop conduction layer to define a second contact hole; forming a contact plug within the second contact hole, the contact plug contacting the lower metal layer; and forming an upper metal layer including a third barrier metal layer and a second metal layer, the upper metal layer contacting the contact plug.

In yet another embodiment, a method of manufacturing a semiconductor device includes providing a semiconductor substrate on which a plurality of transistors has been defined; forming a wiring pattern over the transistors, the wiring pattern being coupled to at least one transistor; depositing an Inter Layer Dielectric (ILD) film over the wiring pattern; defining a first contact hole in the ILD film, the first contact hole exposing a portion of the wiring pattern; forming a lower metal layer including a first barrier metal layer, a first metal layer, and a second barrier metal layer, the lower metal layer contacting the wiring pattern via the first contact hole; forming a contact hole stop conduction layer over the lower metal layer; patterning the contact hole stop conduction layer and the lower metal layer to define one or more through-holes; depositing an Inter Metal Dielectric (IMD) film over the contact hole stop conduction layer, the IMD film filling the one or more through-holes; etching a selected portion of the IMD film using a first etch step at least until the contact hole stop conduction layer is substantially exposed; etching the exposed contact hole stop conduction layer using a second etch step until the second barrier metal layer is exposed, so that a second contact hole is defined; forming a contact plug within the second contact hole, the contact plug contacting an upper surface of the lower metal layer; and forming an upper metal layer over the contact plug and the IMD film, the upper metal layer contacting an upper surface of the contact plug.

BRIEF DESCRIPTION OF THE DRAWINGS

A more complete appreciation of the invention and many of the attendant advantages thereof, will be readily apparent and better understood with reference to the following detailed description in conjunction with the accompanying drawings in which like reference symbols indicate the same or similar components, wherein.

DETAILED DESCRIPTION OF EMBODIMENTS

Figure 1:
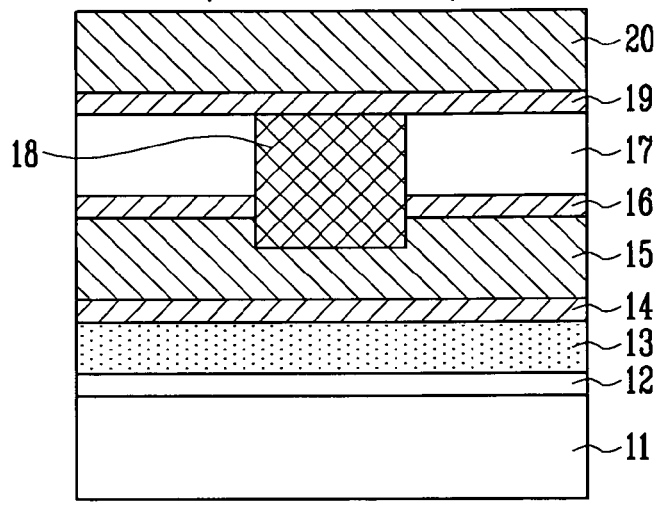
FIG. 1 is a cross-sectional view of a semiconductor substrate illustrating a method of manufacturing a semiconductor device in the related art.

In the following detailed description, only certain specific embodiments of the present invention have been shown and described by way of illustration. As those skilled in the art will realize, the described embodiments may be modified in various ways, all without departing from the spirit or scope of the present invention. Accordingly, the drawings and description are to be regarded as illustrative in nature and not restrictive. Like reference numerals designate like elements throughout.

Figure 2A:
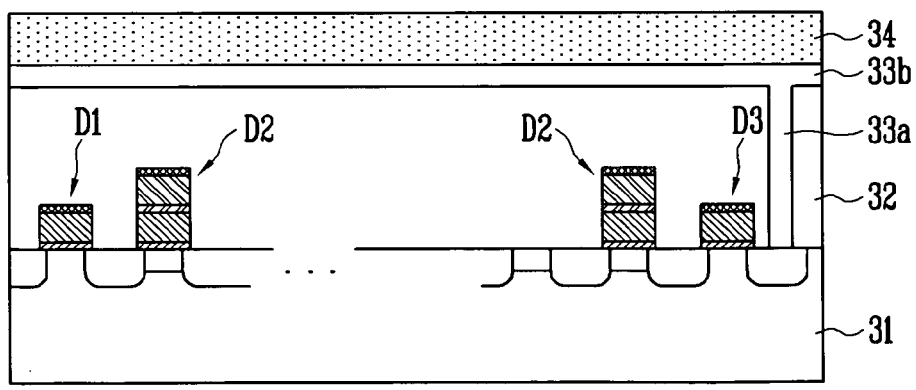
FIGS. 2A to 2G are cross-sectional views of a semiconductor substrate illustrating a manufacturing method according to an embodiment of the present invention.

Referring to FIG. 2A, a semiconductor substrate 31 is provided on which a plurality of unit elements D1, D2 and D3 are formed. D1 designates a source select transistor, D2 designates a memory cell transistor and D3 designates a drain select transistor. These unit elements may also be referred to as gates or gate structures. An interlayer insulation film 32 is then formed on the entire structure. After that a photolithography and etch process is performed on the interlayer insulation film 32 to form a contact hole (not shown).

A first conduction layer (not shown) is deposited on the entire interlayer insulation film 32, so that the contact hole is filled with the first conduction layer. A polishing process using the interlayer insulation film 32 as a stop layer is then performed to a contact plug 33a.

Thereafter, a second conduction layer is deposited on the interlayer insulation film 32 in which the contact plug 33a has been formed. The second conduction layer is patterned by a photolithography-and-etch process, forming a wiring pattern 33b (for example, a bit line pattern). Then an ILD oxide film 34 is formed on the wiring pattern 33b.

Figure 2B:
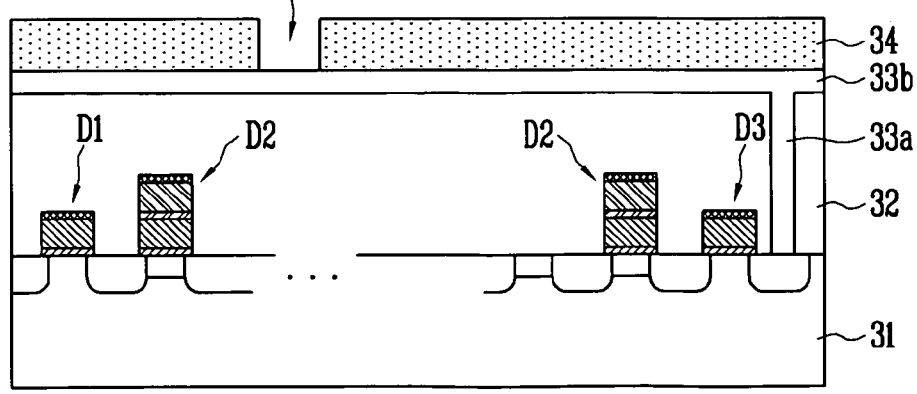

Referring to FIG. 2B, a photolithography and etch process is carried out on the ILD oxide film 34, forming a contact hole 35 in the ILD oxide film 34.

Figure 2C:
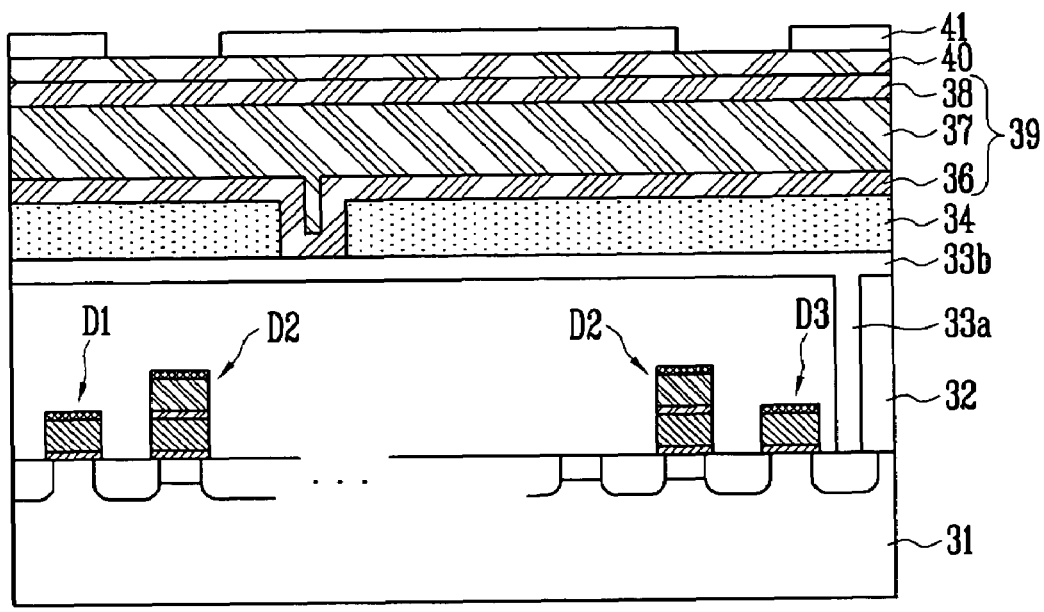

Referring to FIG. 2C, a first barrier metal layer 36, a first metal layer 37 and a second barrier metal layer 38 are sequentially deposited on the entire ILD oxide film 34, which together define a lower metal layer 39. Consequently, the contact hole 35 is filled-in with the first barrier metal layer 36 and the first metal layer 37.

The first and second barrier metal layers 36, 38 may be formed using Ti or TiN and the first metal layer 37 may be formed using Al. Furthermore, the first barrier metal layer 36 functions to facilitate the adhesion to the ILD oxide film 34 and the first metal layer 37 and prevent the first metal layer 37 from diffusing into the ILD oxide film 34.

A contact hole stop conduction layer 40 is formed on the lower metal layer 39. The contact hole stop conduction layer 40 may be formed using tungsten (W), platinum (Pt), ruthenium (Ru), iridium (Ir) and copper (Cu) and may be formed to a thickness of 10 Å to 3000 Å.

A photoresist (not shown) is coated on the contact hole stop conduction layer 40. A photoresist pattern 41 is formed by an exposure and development process.

Figure 2D:
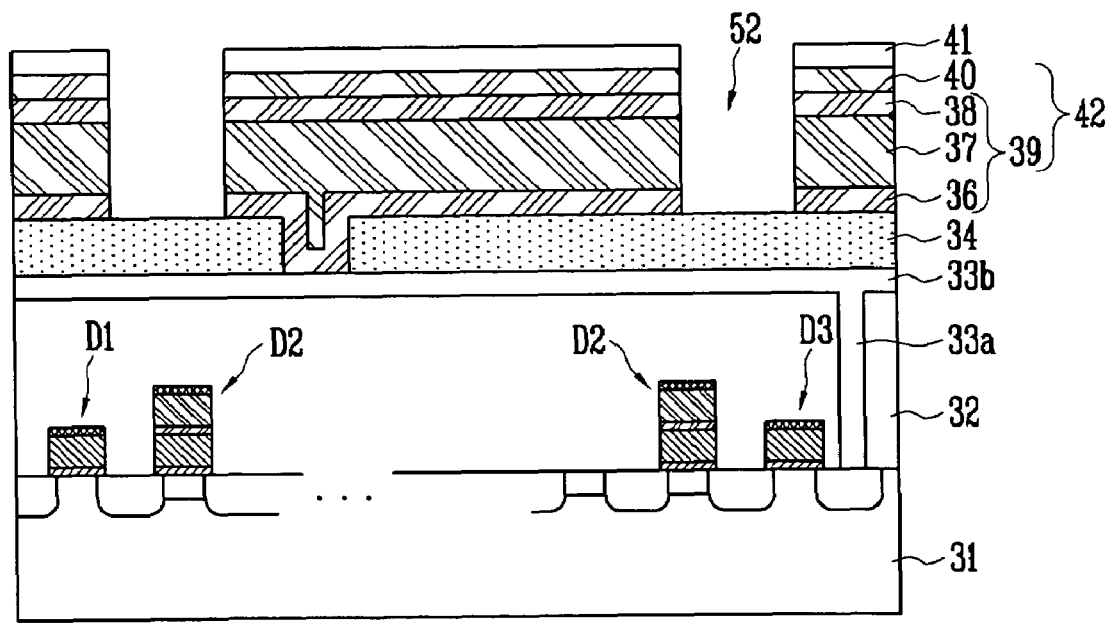

Referring to FIG. 2D, an etch process using the photoresist pattern 41 as an etch mask is performed on the contact hole stop conduction layer 40 and the lower metal layer 39. A structure 42 comprised of the contact hole stop conduction layer 40 and the lower metal layer 39 is formed. Alternatively, the contact hole stop conduction layer 40 may be used as an etch mask of the lower metal layer 39. This will be described below in more detail. Only the contact hole stop conduction layer 40 is etched by performing an etch process using the photoresist pattern 41 as an etch mask. After the photoresist pattern 41 is stripped, an etch process using the contact hole stop conduction layer 40 as an etch mask is performed to etch the lower metal layer 39. As a result, one or more through-holes 52 are defined to pattern the structure 42. The holes expose the ILD oxide film 34.

Figure 2E:
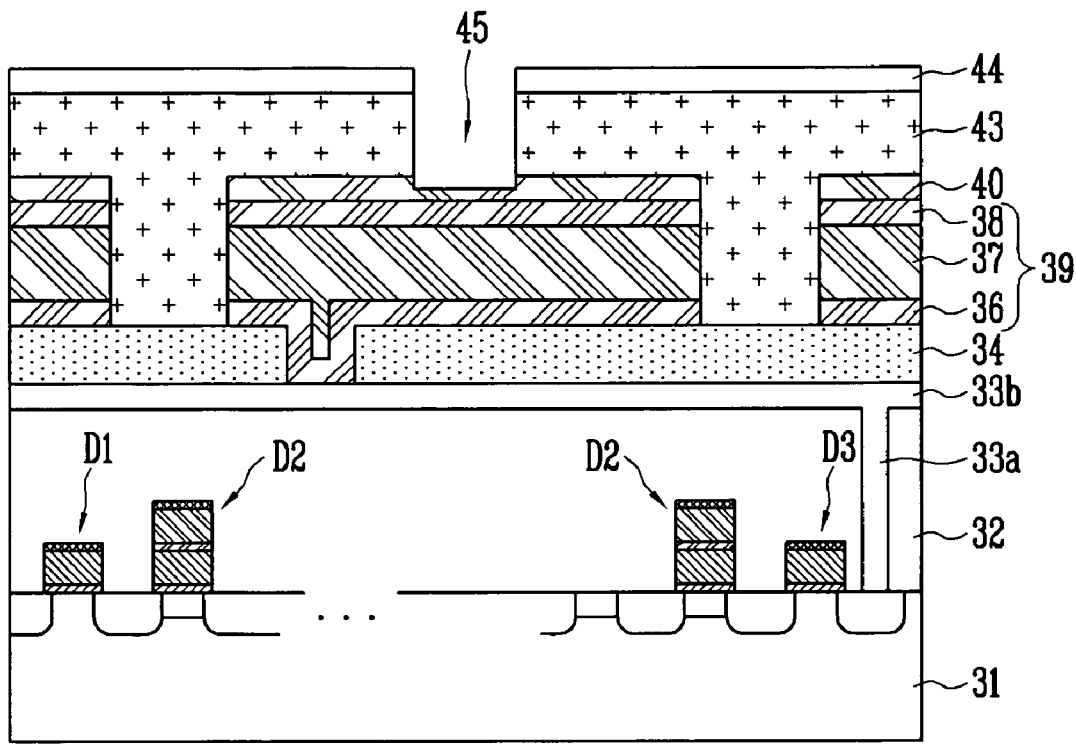

Referring to FIG. 2E, the photoresist pattern 41 is stripped. An IMD oxide film 43 is deposited on the entire structure. A photoresist (not shown) is coated on the IMD oxide film 43. A photoresist pattern 44 is formed on the IMD oxide film 43 by means of an exposure and development process. The IMD oxide film 43 is then etched by performing an etch process (or first etch step) using the photoresist pattern 44 as an etch mask. Consequently, a hole 45 is formed within the IMD oxide film 43. In this case, the IMD oxide film 43 may be etched using a plasma etch process using an etch gas that has high selectivity to the contact hole stop conductive layer 40. In the present embodiment, $C_xH_yF_z$ gas is used for its high selectivity to tungsten material used for the layer 40.

Meanwhile, in the etch process of the IMD oxide film 43, the etch rate of the IMD oxide film 43 is higher than that of the contact hole stop conduction layer 40 causing the IMD oxide film 43 to be removed faster. Because of this, only part of the contact hole stop conduction layer 40 below the hole 45 is etched, leaving a thin layer of the contact hole conduction layer 40.

Figure 2F:
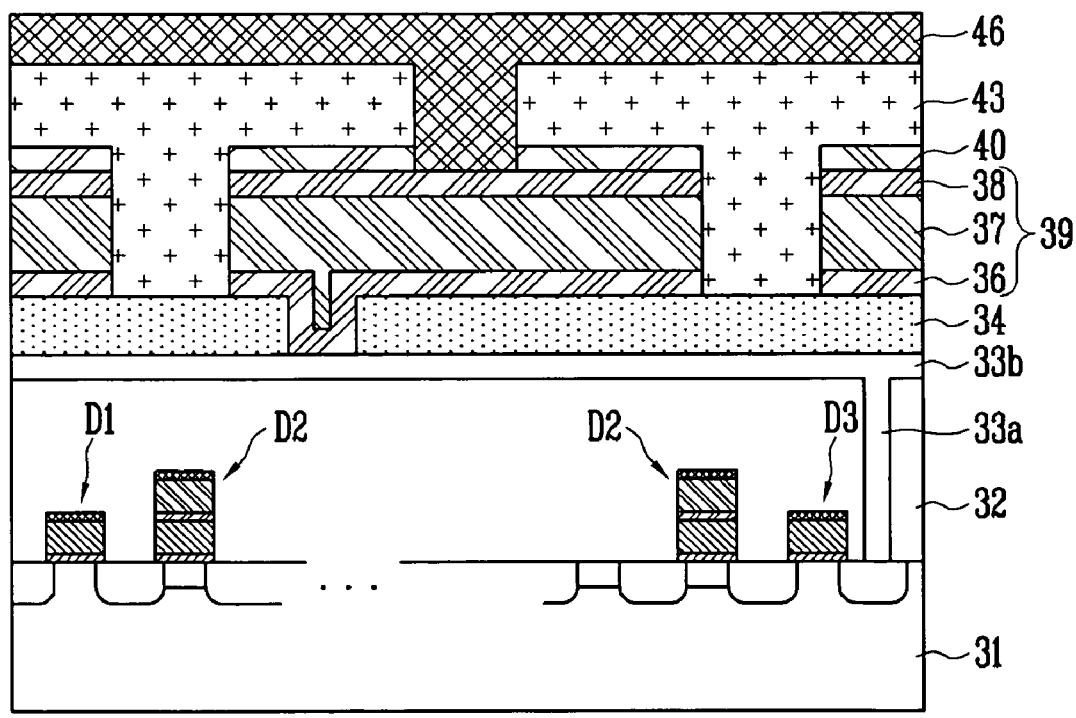

Referring to FIG. 2F, the photoresist pattern 44 is stripped. A Radio Frequency (RF) sputtering process (or second etch step) is then performed to remove a thin layer of the contact hole stop conduction layer 40 remaining below the hole 45, thereby defining a second contact hole that exposes the upper surface of the lower metal layer. In the present embodiment, the RF sputtering or second etch step is designed to accurately remove a thin layer of material, so that the accidental removal of the upper metal layer would be minimized during the second etch step. Thereafter, a contact plug metal layer 46 is deposited on the entire IMD oxide film 43 to fill-in the second contact hole 45. At this time, the sputtering process and the deposition process of the contact plug metal layer 46 may be performed in-situ.

In this case, the thickness of the contact hole stop conduction layer 40 may be determined by the thickness of the contact hole stop conduction layer 40 remaining below the hole 45 after the first etch step.

Figure 2G:
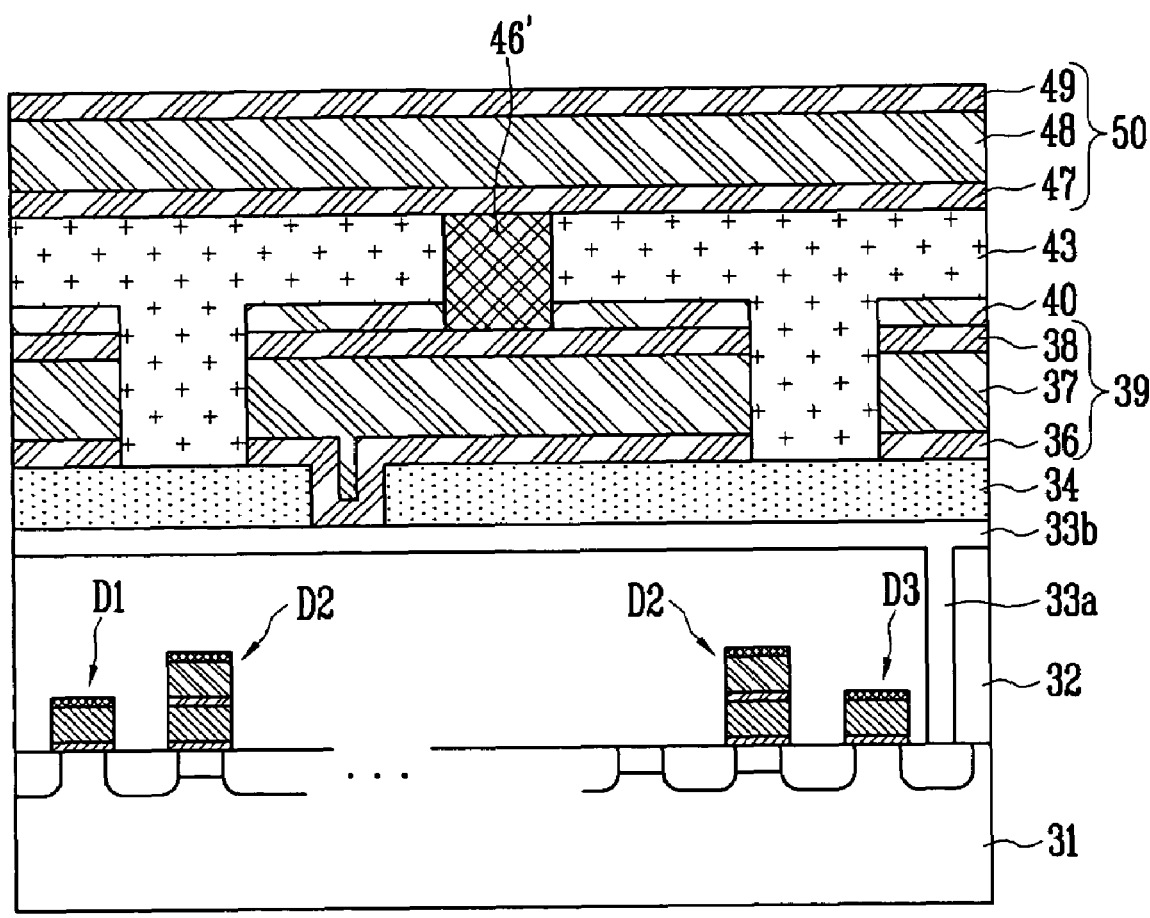

Referring to FIG. 2G, a polishing process using the IMD oxide film 43 as a stop layer is performed on the contact plug metal layer 46, forming a contact plug 46' within the second contact hole. At this time, the contact plug metal layer 46 may be polished using Chemical Mechanical Polishing (CMP) or plasma.

The third barrier metal layer 47, the second metal layer 48 and a fourth barrier metal layer 49 are sequentially deposited on the entire IMD oxide film 43 in which the contact plug 46' is formed. These three layers form an upper metal layer 50. At this time, the third barrier metal layer 47 and the fourth barrier metal layer 49 may be formed using Ti or TiN and the second metal layer 48 may be formed using Al. Other conductive materials may be used for these layers.

As described above and according to an embodiment of the present invention, the contact hole stop conduction layer is formed on the lower metal layer. Therefore, when forming a contact hole for a contact plug between the lower metal layer and the upper metal layer in the IMD oxide film, the lower metal layer can be prevented from being etched. Accordingly, variation in the contact resistance between the upper metal layer and the lower metal layer can be minimized and yield can be improved when mass producing semiconductor devices.

Furthermore, according to another embodiment of the present invention, the contact hole stop conduction layer formed on the lower metal layer can be used as the etch mask of the lower metal layer. It is therefore possible to improve the etch-patterning margin of the lower metal layer.

In addition, according to an embodiment of the present invention, the contact hole stop conduction layer is formed on the lower metal layer. Accordingly, the thickness of the lower metal layer can be reduced. When the IMD oxide film is deposited on a patterned lower metal layer, the gap-fill margin of the IMD oxide film can be improved.

While the invention has been described in connection with what is presently considered to be specific embodiments, it is to be understood that the invention is not limited to the disclosed embodiments, but is intended to cover various modifications and equivalent arrangements included within the spirit and scope of the appended claims.

What is claimed is:

1. A method of manufacturing a semiconductor device, the method comprising:
providing a semiconductor substrate on which a plurality of transistors has been defined;
forming a wiring pattern over the transistors, the wiring pattern being coupled to at least one transistor;
depositing an Inter Layer Dielectric (ILD) film over the wiring pattern;
defining a first contact hole in the ILD film, the first contact hole exposing a portion of the wiring pattern;
forming a lower metal layer including a first barrier metal layer, a first metal layer, and a second barrier metal layer, the lower metal layer contacting the wiring pattern via the first contact hole;
forming a contact hole stop conduction layer over the lower metal layer;
patterning the contact hole stop conduction layer and the lower metal layer to define one or more through-holes;
depositing an Inter Metal Dielectric (IMD) film over the contact hole stop conduction layer, the IMD film filling the one or more through-holes;
etching a selected portion of the IMD film using a first etch step, the first etch stop substantially exposing the contact hole stop conduction layer and removing a portion of the contact hole stop conduction layer, thereby providing the contact hole stop conduction layer with a reduced thickness;
etching the contact hole stop conduction layer of the reduced thickness using a second etch step until the second barrier metal layer is exposed, so that a second contact hole is defined;
forming a contact plug within the second contact hole, the contact plug contacting an upper surface of the lower metal layer; and
forming an upper metal layer over the contact plug and the IMD film, the upper metal layer contacting an upper surface of the contact plug.

2. The method of claim 1, wherein the first etch step uses an etch gas that has high selectivity to the contact hole stop conduction layer.

3. The method of claim 1, wherein the contact hole stop conduction layer comprises conductive material.

4. The method of claim 3, wherein the contact hole stop conduction layer comprises tungsten (W), platinum (Pt), ruthenium (Ru), iridium (Ir) and copper (Cu).

5. The method of claim 1, wherein the contact hole stop conduction layer is formed on the lower metal layer to a thickness of 10 Å to 3000 Å.

6. The method of claim 1, wherein the second etch step involves a Radio Frequency (RF) sputtering process to remove the contact hole stop conduction layer remaining over the lower metal layer, the method further comprising:
after the second etch step, depositing in-situ a contact plug metal layer on the IMD film to fill the second contact hole; and
polishing the contact plug metal layer using the IMD film as a stop layer to form the contact plug.

7. The method of claim 6, wherein in the step of forming the contact hole stop conduction layer, a thickness of the etch stop layer formed over the lower metal layer is determined by a thickness of the contact hole stop conduction layer remaining over the lower metal layer after the first etch step and a thickness of the contact hole stop conduction layer etched by the second etch step.

8. The method of claim 1, wherein the first etch step is a plasma etch process employing $C_xH_yF_z$ gas.

9. A method of manufacturing a semiconductor device, the method comprising:
providing a semiconductor substrate on which a plurality of transistors are defined;

forming a wiring pattern over the transistors, the wiring pattern contacting at least one transistor;

depositing a first oxide film over the wiring pattern;

defining a first contact hole on the oxide film, the first contacting hole exposing the wiring pattern;

forming a lower metal layer having a first barrier metal layer, a first metal layer and a second barrier metal layer over the oxide film, the lower metal layer filling the first contact hole;

forming a contact hole stop conduction layer over the lower metal layer;

depositing a second oxide film over the etch stop layer;

etching a selected portion of the second oxide film to form a hole exposing the contact hole stop conduction layer;

etching the exposed contact hole stop conduction layer to define a second contact hole;

forming a contact plug within the second contact hole, the contact plug contacting the lower metal layer; and forming an upper metal layer including a third barrier metal layer and a second metal layer, the upper metal layer contacting the contact plug.

10. The method of claim 9, wherein the contact hole stop conduction layer comprises tungsten (W), platinum (Pt), ruthenium (Ru), iridium (Ir) and copper (Cu).

11. The method of claim 9, wherein the contact hole stop conduction layer is formed to a thickness of 10 Å to 3000 Å.

12. The method of claim 9, wherein the exposed contact hole stop conduction layer is etched using a RF sputtering process, wherein the contact plug is formed by depositing in-situ a contact plug metal layer into the second contact hole after the RF sputtering process.

13. The method of claim 12, wherein the contact plug metal layer is removed using a chemical mechanical polishing step to form the contact plug, the second oxide film being used as a stop layer.

14. The method of claim 7, wherein the selected portion of the second oxide film is etched using $C_xH_yF_z$ gas.

15. A method of manufacturing a semiconductor device, the method comprising:

providing a semiconductor substrate on which a plurality of transistors have been defined;

forming a wiring pattern over the transistors, the wiring pattern being coupled to at least one transistor;

depositing an Inter Layer Dielectric (ILD) film over the wiring pattern;

defining a first contact hole in the ILD film, the first contact hole exposing a portion of the wiring pattern;

forming a lower metal layer including a first barrier metal layer, a first metal layer, and a second barrier metal layer, the lower metal layer contacting the wiring pattern via the first contact hole;

forming a contact hole stop conduction layer over the lower metal layer;

patterning the contact hole stop conduction layer and the lower metal layer to define one or more through-holes;

depositing an Inter Metal Dielectric (IMD) film over the contact hole stop conduction layer, the IMD film filling the one or more through-holes;

etching a selected portion of the IMD film using a first etch step at least until the contact hole stop conduction layer is substantially exposed;

etching the exposed contact hole stop conduction layer using a second etch step until the second barrier metal layer is exposed, so that a second contact hole is defined;

forming a contact plug within the second contact hole, the contact plug contacting an upper surface of the lower metal layer; and forming an upper metal layer over the contact plug and the IMD film, the upper metal layer contacting an upper surface of the contact plug.

* * * * *